United States Patent [19]

Saito

[11] 4,270,188
[45] May 26, 1981

[54] NONVOLATILE SEMICONDUCTOR MEMORY APPARATUS

[75] Inventor: Shozo Saito, Yokohama, Japan

[73] Assignee: Tokyo Shibaura Denki Kabushiki Kaisha, Kawasaki, Japan

[21] Appl. No.: 98,746

[22] Filed: Nov. 30, 1979

[30] Foreign Application Priority Data

Dec. 7, 1978 [JP] Japan .................................. 53/150555

[51] Int. Cl.³ ............................................. G11C 11/40
[52] U.S. Cl. ..................................... 365/189; 365/78; 307/238.6
[58] Field of Search ................. 365/78, 174, 182, 189; 307/238

[56] References Cited

U.S. PATENT DOCUMENTS 3,950,737  4/1976  Uchida et al. .......................... 365/78

Primary Examiner—Terrell W. Fears
Attorney, Agent, or Firm—Oblon, Fisher, Spivak, McClelland & Maier

[57] ABSTRACT

A nonvolatile semiconductor memory apparatus is provided which comprises a flip-flop circuit formed of a pair of MOS FETs and a pair of MNOS FETs coupled to the bistable output terminals of the flip-flop circuit, respectively. The memory apparatus further has a pair of MOS FETs coupled to have the current paths in parallel with the current paths of the pair of MOS FETs of the flip-flop circuit.

18 Claims, 10 Drawing Figures

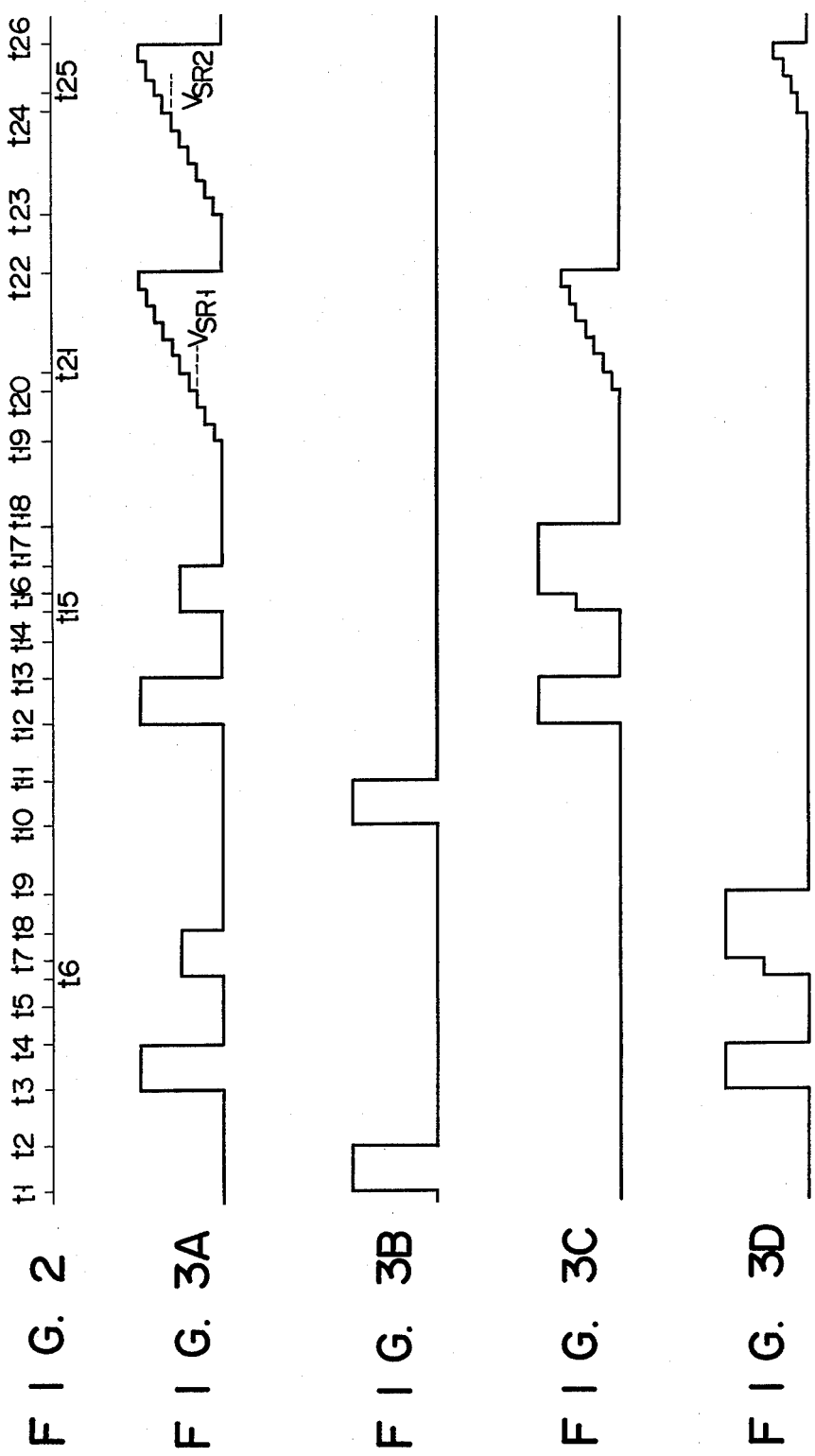

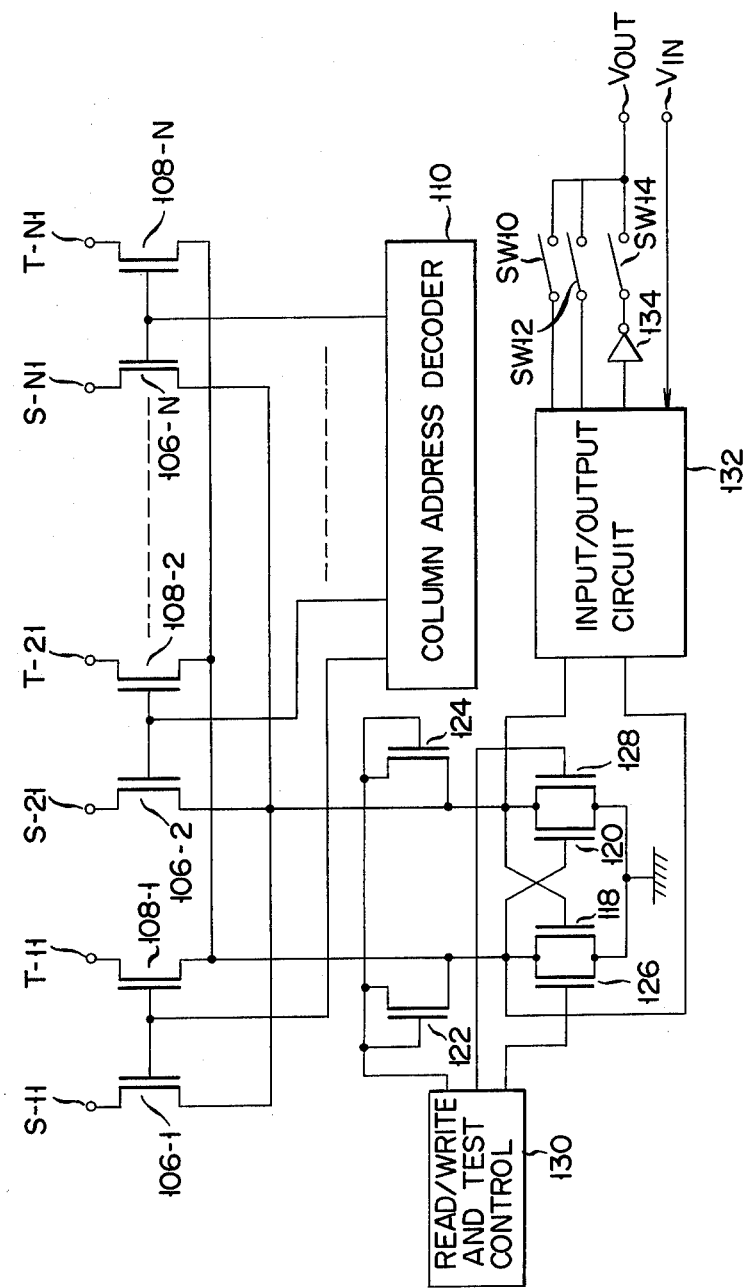
F I G. 5

NONVOLATILE SEMICONDUCTOR MEMORY APPARATUS

BACKGROUND OF THE INVENTION

This invention relates to a nonvolatile semiconductor memory apparatus formed of electrically alterable read only memories.

Electrically alterable read only memories utilizing variable threshold voltage field effect transistors have attracted attention because of capabilities of storing information in a nonvolatile manner and electrically altering the stored information. Such a class of memories may be broken down into two kinds, one kind having memory cells each formed of a single variable threshold voltage field effect transistor (herein called one-transistor memory cell) and the other having memory cells each formed of two variable threshold voltage field effect transistors (herein called two-transistor memory cell). The onetransistor memory cell has the field effect transistor turned on and off when a read-out voltage applied to its gate electrode is higher and lower than a threshold voltage of the field effect transistor, respectively. Thus, information stored in the memory cell is enabled to be read out in accordance with the conduction state of the field effect transistor. A threshold voltage once set up in the field effect transistor may, however, vary with time so that a difference between the threshold voltage of the field effect transistor and a preset readout voltage to turn on the field effect transistor grows smaller with lapse of time. After lapse of long time, application of the turning-on readout voltage can not allow the field effect transistor to turn on.

Information is written in the two-transistor memory cell by setting a threshold voltage of one field effect transistor higher than that of the other transistor, and the same is read out by applying a readout voltage to both of the field effect transistors to detect which field effect transistor turns on first. Readout operation in the two-transistor memory cell is explained in detail in U.S. Pat. No. 3,651,492. Information stored in the two-transistor memory cell is thus read out in terms of a difference between threshold voltages of the two field effect transistors. Such a difference will grow smaller with lapse of time and yet the level relationship between threshold voltages of the two field effect transistors remains unchanged so that information stored in this kind of memory cell can be readout for a relatively long time period in terms of a difference between threshold voltages of the two field effect transistors in comparison with the one-transistor memory cell. Further, the two-transistor memory cell can be less influenced by fluctuations in threshold voltage of the field effect transistors. Since, stored information is readout in the form of a relative difference between threshold voltages of the field effect transistors in the two-transistor memory cell, any variation in the threshold voltages of the transistors can not be directly detected so that no method is available to determine how long the information is kept held in an effective state, thus lowering reliability of this type of memory cell.

SUMMARY OF THE INVENTION

An object of this invention is to provide a nonvolatile semiconductor memory apparatus in which the threshold voltage of each variable threshold voltage field effect transistor can be directly detected and which can steadily hold information for a relatively long time.

According to one embodiment of the invention, there is provided a nonvolatile semiconductor memory apparatus which comprises a flip-flop circuit formed of a pair of gate insulated field effect transistors, at least one pair of electrically alterable nonvolatile memory cell elements coupled to the bistable output terminals of said flip-flop circuit, voltage signal supply means for selectively supplying predetermined voltage signal to the bistable output terminals of said flip-flop circuit, short-circuiting means for selectively shortcircuiting current paths of said pair of gate insulated field effect transistors, and control voltage supply means for supplying a control voltage to said memory cell elements.

BRIEF DESCRIPTION OF THE ACCOMPANYING DRAWINGS

FIGS. 2 and 3A to 3D are timing diagram and waveform diagrams, respectively, for illustrating operation of the nonvolatile memory apparatus of FIG. 1;

FIGS. 4 and 5 are circuit diagrams showing nonvolatile memory apparatus according to another embodiment of this invention;

DETAILED DESCRIPTION OF THE PREFERRED EMBODIMENTS

Figure 1:
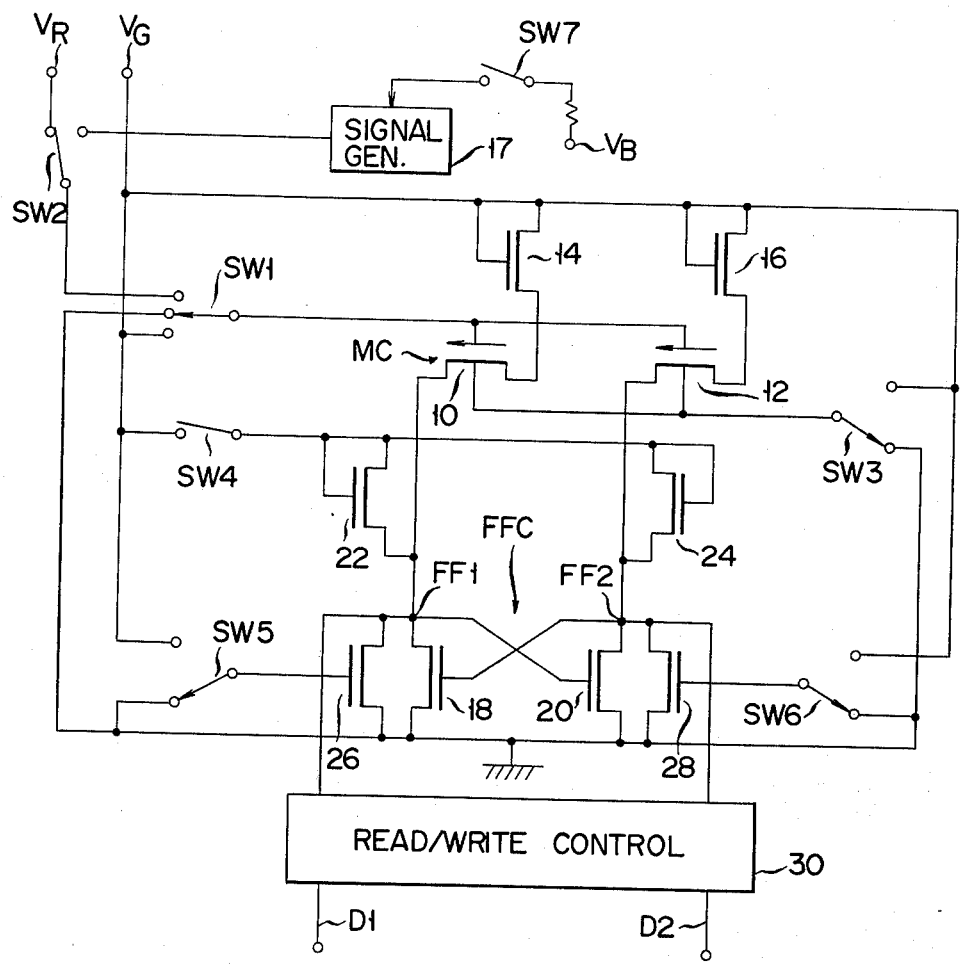
FIG. 1 is a circuit diagram showing a nonvolatile memory apparatus according to one embodiment of this invention.

FIG. 1 shows a circuit diagram of a nonvolatile semiconductor memory apparatus according to one embodiment of the invention. The memory apparatus has a two-transistor memory cell MC formed of a pair of nonvolatile variable threshold field effect transistors 10 and 12 such as metal-nitride-oxide-semiconductor (MNOS) field effect transistors. The MNOS FETs may be provided by forming, for instance, a silicon dioxide (SiO$_2$) film as thin as about 20 Å on a silicon substrate, a silicon nitride (Si$_3$N$_4$) film of thickness of 500 to 1,000 Å on the SiO$_2$ film, and finally a conductor film of aluminum or the like on the Si$_3$N$_4$ film, where a charge trap zone is formed adjacent the interface between the SiO$_2$ and the Si$_3$N$_4$ films. Threshold voltages of the MNOS FETs will vary depending upon whether charge is trapped in the charge trap zone. Supposing that an N-channel MNOS FET, for instance, has the substrate grounded, the source and drain electrodes supplied with 0 V and the gate electrode applied with +30 V, the threshold voltage of the MNOS FET becomes about 10 V, which places the MNOS FET in the write state. When the gate electrode of the MNOS FET is grounded, with the substrate being applied with +30 V, the threshold voltage thereof becomes about +1 V, which turns the MNOS FET to the erase state. When the source and drain electrodes of the MNOS FET in the erase state are applied with +30 V, with the gate electrode being applied with +30 V, the threshold voltage is not shifted, which means that the MNOS FET is placed in the inhibit state. Write operation of data into the MNOS FET is performed by selectively setting the MNOS FET to the write, erase and inhibit states.

Load MOS FETs 14 and 16 are coupled between the drain electrodes of these MNOS FETs 10 and 12 and a power source terminal $V_G$ of, for instance, 30 V, respectively. The gate electrodes of MNOS FETs 10 and 12 are commonly coupled to a gate voltage selection switching circuit SW1 which has first to third switching positions thereby allowing the gate electrodes of MNOS FETs 10 and 12 to be selectively coupled to power source terminal $V_G$, ground terminal, and a switching terminal of a switching circuit SW2 which is selectively coupled to a power source terminal $V_R$ and a stepwise readout signal generator 17. Further, the substrate electrodes of MNOS FETs 10 and 12 are commonly coupled to a substrate potential selection switching circuit SW3 which has first and second switching positions thereby allowing the substrate of MNOS FETs 10 and 12 to be selectively coupled to source terminal $V_G$ and ground terminal.

The source electrodes of MNOS FETs 10 and 12 are coupled to the bistable output terminals FF 1 and FF 2 of a flip-flop circuit FFC, respectively, the flip-flop circuit FFC being formed of a pair of MOS FETs 18 and 20. In other words, the source electrode of MNOS FET 10 is coupled to the drain electrode of the MOS FET 18 having the source electrode grounded and to the gate electrode of the MOS FET 20 having the source electrode grounded, and the source electrode of MNOS FET 12 is coupled to te gate electrode of MOS FET 18 and the drain electrode of MOS FET 20. The output terminals FF1 and FF2 of the flip-flop circuit FFC are coupled through load MOS FETs 22 and 24, respectively, to a switching circuit SW4 which functions to couple output terminals FF1 and FF2 of the flip-flop circuit FFC through MOS FETs 22 and 24 to the power source terminal $V_G$. The output terminals FF1 and FF2 of flip-flop circuit FFC are coupled to the drain electrodes of MOS FETs 26 and 28, respectively, the MOS FETs 26 and 28 both having the source electrodes grounded. The gate electrodes of MOS FETs 26 and 28 are coupled to switching circuits SW 5 and SW 6, respectively. The switching circuit SW 5 has first and second switching positions thereby allowing the gate electrode of MOS FET 26 to be selectively coupled to the power source terminal $V_G$ and the ground terminal, and the switching circuit SW 6 has first and second switching positions thereby allowing the gate electrode of MOS FET 28 to be selectively coupled to the source terminal $V_G$ and the ground terminal. The output terminals FF 1 and FF 2 of the flip-flop circuit FFC are coupled to a read/write control circuit for control of operations of writing and reading out data in and from MNOS FETs 10 and 12. Each of the field effect transistors incorporated in the circuitry stated in the foregoing is of N-channel type.

Operation of the memory circuit shown in FIG. 1 will be described with reference to the timing diagram of FIG. 2 and the signal waveform diagrams of FIGS. 3A to 3D.

Switching circuits SW 1 to SW 6 in memory circuit of FIG. 1 as in the initial state are all set in the switching positions as shown. In the period of time t1 to t2 as shown in FIG. 2 while the gate voltages of MNOS FETS 10 and 12 are maintained at 0 v as shown in FIG. 3A, the substrate voltages of the MNOS FETs 10 and 12 are set as shown in FIG. 3B at power source voltage $V_G$, for example, +30 V by setting the switching circuit SW 3 to the first switching position, thereby setting both the threshold voltages $V_{TH}$ of MNOS FETs 10 and 12 at $V_{TH0}$, for example +1 V, which means the MNOS FETs 10 and 12 are set in the erase state. In the period of time t3 to t4, the switching circuit SW 3 is set to the second switching position thereby setting the substrate voltages of MNOS FETs 10 and 12 to 0 V and the switching circuit SW 1 is set to the first switching position thereby setting the gate voltages of MNOS FETs 10 and 12 to power source voltage $V_G$. Simultaneously, output terminals FF1 and FF2 of the flip-flop circuit FFC are set to low and high voltage levels, respectively, as shown in FIGS. 3C and 3D. At this time, the read/write control circuit 30 is supplied through data lines D1 and D2 with a predetermined data from an external circuitry (not shown) to supply low and high level voltages to the output terminals FF1 and FF2 of the flip-flop circuit FFC, thus setting the output state of the flip-flop circuit FFC. This sets MNOS FET 10 to the write state with the threshold voltage of MNOS FET 10 being at $V_{TH1}$, for example, +10 V and the MNOS FET 12 to the inhibit state with the threshold voltage of MNOS FET 12 being kept to be held at $V_{TH0}$. Data written in memory circuit of FIG. 1 is thus stored in a nonvolatile manner after time t4 in the form of logical value "1" or "0" in accordance with a difference ($V_{TH1} - V_{TH0}$) between threshold voltages of the two MNOS FETs 10 and 12. The data stored in the memory cell MC in a condition that MNOS FETs 10 and 12 have threshold voltages of $V_{TH1}$ and $V_{TH0}$, respectively, is supposed to be "1". The threshold voltages of MNOS FETs 10 and 12 will gradually change. The threshold voltage of MNOS FET 10 will decrease from $V_{TH1}$ toward 0 V, while that of MNOS FET 12 will change from $V_{TH0}$ in the positive direction, resulting in decreasing a difference between the threshold voltages of MNOS FETs 10 and 12 until the time will arrive at last, as hereinafter stated, that data "1" can not be read out any longer from the bistable output terminals FF1 and FF2 of the flip-flop circuit FFC. Thus, a data holding time period during which data "1" can be held in a nonvolatile manner in memory circuit may be defined to extend from time t4 to the time that the data cannot be read out any longer.

A period of time during which for data "1" to be read out from the memory cell MC is assigned to a time of t5 to t9. In time section of t5 to t6, flip-flop circuit FFC is reset with output voltage of the bistable output terminals FF1 and FF2 being set to the low level. In the next time section of t6 to t8, the switching circuit SW 1 is set to the third switching position thereby applying readout voltage $V_R$ to the gate electrode of MNOS FETs 10 and 12. Since the threshold voltage has been set to $V_{TH0}$, the MNOS FET 12 is rendered conductive earlier than MNOS FET 10. This sets the flip-flop circuit FFC with the output voltage level of the bistable output terminal FF1 and being held low, and the voltage level of the bistable output terminal FF2 being equal to a value obtained by subtracting the threshold voltage of MNOS FET 12 from readout voltage $V_R$. In time of t7 to t9, the switching circuit SW 4 is closed thereby allowing the output voltage at the output terminal FF2 of flip-flop circuit FFC to rise, as shown in FIG. 3D, to a value obtained by subtracting the threshold voltage of MOS FET 24 from the power source voltage $V_G$. Because MOS FET 18 has been rendered conductive at this time, the output voltage at the output terminal FF1 remains to be held at the low level as shown in FIG. 3C.

The switching circuit SW 1 is set to the second switching position, bringing the gate voltages of MNOS FETs 10 and 12 to 0 V at time t8. Since, at this time, the switching circuit SW 4 is kept closed, the output state of flip-flop circuit FFC is not affected, but maintained stable so that data can be well read out from the memory circuit.

The switching circuits SW 1 and SW 3 are so set as to set MNOS FETs 10 and 12 to the erase state in time of t10 to t11, like in time of t1 to t2. In time of t12 to t13, then, a predetermined data is supplied from an external circuit (not shown) through data lines D1 and D2 to a read/write control circuit 30, thereby allowing the bistable output terminals FF1 and FF2 of flip-flop circuit FFC to be set to high and low voltage levels, respectively, as shown in FIGS. 3C and 3D. Simultaneously, power source voltage $V_G$ is applied to the gate electrodes of MNOS FETs 10 and 11 as shown in FIG. 3A, while 0 V voltage is applied to the substrates thereof as shown in FIG. 3B. This sets MNOS FET 10 to the inhibit state, with the threshold voltage of MNOS FET 10 being maintained at $V_{TH0}$, and MNOS FET 12 to the write state, with the threshold voltage of MNOS FET 12 being changed to $V_{TH1}$. The data stored in memory cell MC in a condition that MNOS FETs 10 and 12 have threshold voltages of $V_{TH0}$ and $V_{TH1}$, respectively, is supposed to be "0".

A readout time period, during which for the data "0" to be read out from the memory cell MC is assigned to a time of t14 to t18. A data readout operation is performed in a substantially similar manner in the time of t14 to t18 as in the time of t5 to t9. The output data "0" from the flip-flop circuit FFC is read out by the read/write control circuit 30 and then transferred through the data lines D1 and D2 to an external circuit (not shown).

In order to determine an effect on data holding characteristics of memory cell MC by variation of the threshold voltage of MNOS FET 10, during a time of t19 to t22, the switching circuit SW 4 is opened and the switching circuits SW 5 and SW 6 are set to the second and the first switching positions, respectively, thereby rendering MOS FET 28 conductive. Simultaneously, the switching circuits SW 1 and SW 2 are set to the third and second switching positions and switching circuit SW 7 is closed, allowing a stepwise readout signal as shown in FIG. 3A to be supplied to the gate electrodes of MNOS FETs 10 and 12 from a stepwise readout signal generator 17. Accordingly, a voltage is derived in the bistable output terminal FF1 of flip-flop circuit FFC, which is, as shown in FIG. 3C, equal to a value resulting from subtraction of the threshold voltage of MNOS FET 10 from the stepwise readout signal $V_{SR}$ supplied from the signal generator 17. A time t20 when a positive output voltage starts to be present at output terminal FF1 of flip-flop circuit FFC, the stepwise readout signal $V_{SR}$ has a voltage level $V_{SR1}$ substantially equal to the threshold voltage of MNOS FET 10.

Since the read/write control circuit 30 has its own threshold voltage $V_{TH3}$, it can detect the output state of flip-flop circuit FFC when a voltage $V_{F1}$ of output terminal FF1 of flip-flop circuit FFC becomes equal to $V_{SR1}+V_{TH3}$, and, for instance generates high and low level signals through data lines D1 and D2, respectively.

Influences on data holding characteristics of the memory cell MC by variation of the threshold voltage of MNOS FET 12 are checked during a time period of t23 to t26. To this end, the switching circuit SW 4 is opened and the switching circuits SW 5 and SW 6 are set to the first and the second switching positions, respectively. MOS FET 26 is thereby rendered conductive. Simultaneously, the switching circuits SW 1 and SW 2 are set to the third and second switching positions and the switching circuit SW 7 is closed, thereby applying a stepwise readout signal as shown in FIG. 3A to the gate electrodes of MNOS FETs 10 and 12. As shown in FIG. 3D, this derives at the bistable output terminal FF2 of the flip-flop circuit FFC, an equal voltage to a value resulting from subtraction of the threshold voltage of MNOS FET 12 from stepwise readout signal $V_{SR}$ supplied from the signal generator 17. At time t24 when a positive output voltage starts to be present at the output terminal FF2 of the flip-flop circuit FFC, the stepwise readout signal $V_{SR}$ has a voltage level $V_{SR2}$ substantially equal to the threshold voltage of MNOS FET 12. When a voltage $V_{F2}$ at the output terminal FF2 of the flip-flop circuit FFC becomes equal to $(V_{SR2}+V_{TH3})$, the read/write control circuit 30 can thus detect the output state of the flip-flop circuit FFC and, for instance, generates low and high level signals through the data lines D1 and D2, respectively.

When high and low level signals or low and high level signals are thus generated from the read/write control circuit 30 and transferred through data lines D1 and D2, respectively, a level of output signal generated from the stepwise readout signal generator 17 may be detected to calculate current threshold voltage of MNOS FET 10 or 12. Measurement of a rate of variation of threshold voltages of MNOS FETs 10 and 12 permits determination of the data holding characteristics of the memory cell MC. The data holding characteristics of the memory cell MC will be influenced by the atmospheric temperature and the number of times of data reading, and the data holding characteristics thus influenced can be determined in the above described manner.

Figure 4:
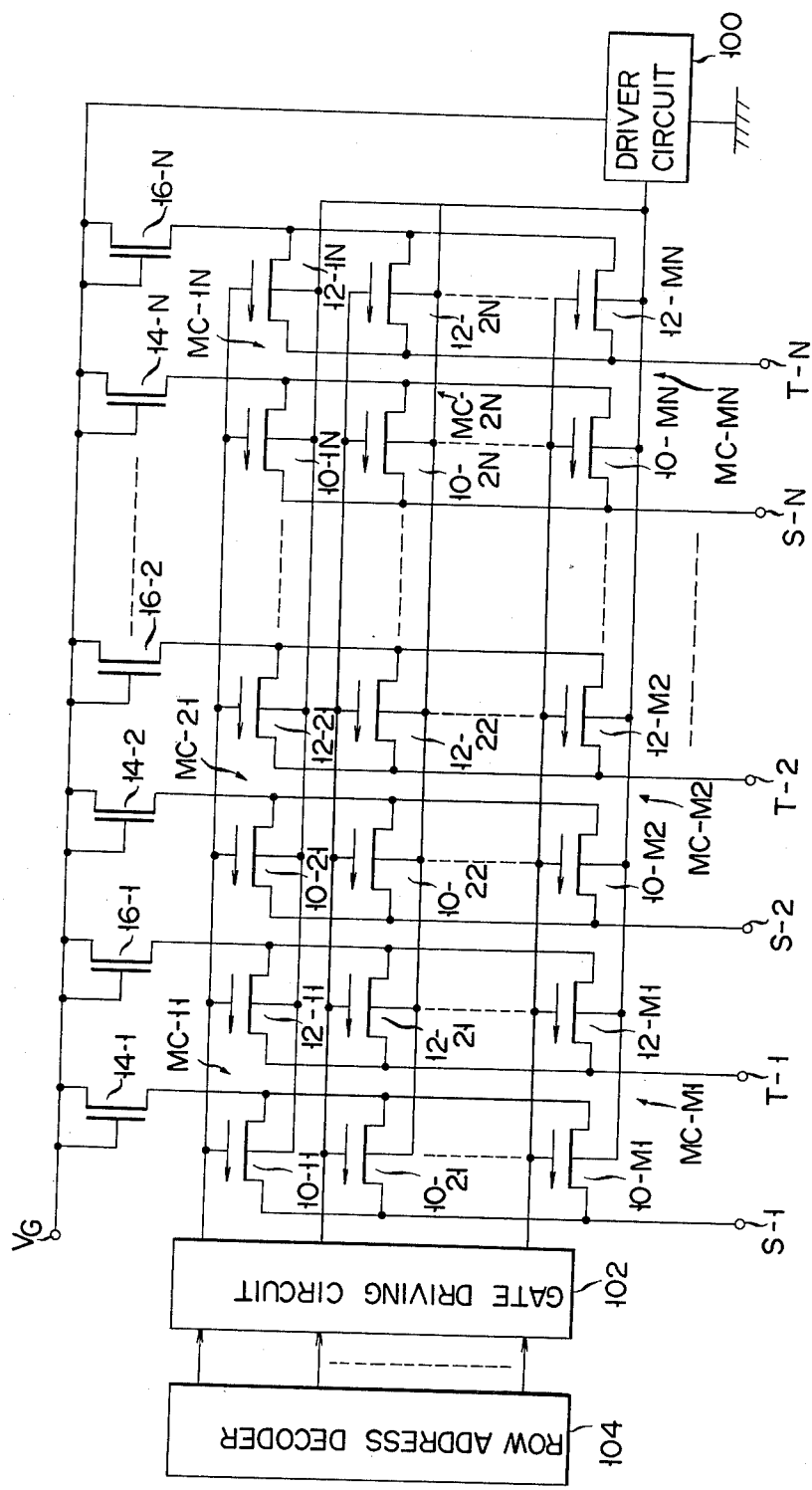

FIGS. 4 and 5 show further embodiments of the invention. A first memory circuit section shown in FIG. 4 has a matrix array of memory cells MC-11 to MC-MN each formed in a similar manner as the memory cell shown in FIG. 1 as formed by a pair of MNOS FETs 10 and 12. Specifically, the memory cells MC-11, MC-12, . . . , MC-2N and MC-MN are formed by pairs of MNOS FETs 10-11 and 12-11, 10-21 and 12-21, . . . , 10-2N and 12-2N, and 10-MN and 12-MN, respectively. The drain terminals of MNOS FETs 10-11 to 10-M1, MNOS FETs 10-12 to 10-M2, . . . , and MNOS FETs 10-1N to 10-MN are coupled through load MOS FETs 14-1, 14-2, . . . , and 14-N to a power source terminal $V_G$. MNOS FETs 12-11 to 12-M1, MNOS FETs 12-21 to 12-M2, . . . , and MNOS FETs 12-1N to 12-MN are similarly coupled through load MOS FETs 16-1, 16-2, . . . , and 16-N to the power source terminal $V_G$.

The substrates of MNOS FETs 10-11 to 10-MN and MNOS FETs 12-11 to 12-MN are coupled to a substrate driver circuit 100 which has a similar function as the switching circuit SW 3 of FIG. 1 to allow the substances of these MNOS FETs to be selectively coupled to power source terminal $V_G$ and ground. Those of MNOS FETs 10-11 to 10-MN and MNOS FETs 12-11 to 12-MN which are arrayed in the same row have the gate electrodes coupled to a gate driver circuit 102 in common. The gate driver circuit 102 has switching circuits each having a similar switching function as the switching circuit SW 1 of FIG. 1 and arranged for each of the rows of MNOS FETs, switching circuits similar to the switching circuits SW 2 and SW 7 and a stepwise readout signal generator similar to the signal generator 17, and is responsive to an address from a row address decoder 104 to select a row of MNOS FETs whose gates are thereby selectively applied with power source voltage $V_G$, readout voltage $V_R$, ground voltage or stepwise readout voltage.

FIG. 5 shows a second memory circuit section combined with the first memory circuit section of FIG. 4 to form a memory circuit according to one embodiment of the invention. The second memory circuit section has terminals S-11 to S-N1 and T-11 to T-N1 to be coupled to terminals S-1 to S-N and T-1 to T-N of the first memory circuit section of FIG. 4, respectively. The terminals S-11 to S-N1 are coupled to the drain electrodes of MOS FETs 106-1 to 106-N, respectively, MOS FETs 106-1 to 106-N having source electrodes coupled in common, while the terminals T-11 to T-N1 are coupled to the drain electrodes of MOS FETs 108-1 to 108-N, respectively, MNOS FETs 108-1 to 108-N having the source electrodes coupled in common. The gate electrodes of MOS FETs 106-1 and 108-1, 106-2 and 108-2, . . . , and 106-N and 108-N in pair are coupled in common to each other and to a column address decoder 110 which applies an address signal selectively to the gates of MOS FETs 106-1 to 106-N and 108-1 to 108-N for selecting one column of MOS FETs from MNOS FETs 10-11 to 10-MN and 12-11 to 12-MN.

MOS FETs 118 and 120 are coupled to each other like the MOS FETs 18 and 20, thus forming a flip-flop circuit. The drain electrode of MOS FET 118 is coupled in common to the source electrodes of MNOS FETs 108-1 to 108-N, while the drain electrode of MOS FET 120 is coupled in common to the source electrodes of MNOS FETs 106-1 to 106-N. A read/write and test control circuit 130 is coupled through MOS FETs 122 and 124 to the drain electrodes of MOS FETs 118 and 120, respectively. The control circuit 130 has a similar switching circuit (not shown) to the switching circuit SW 4 and actuates the switching circuit to selectively apply power source voltage $V_G$ to the drain electrodes of MOS FETs 118 and 128. Further, MOS FETs 126 and 128 are coupled to have current paths in parallel with those of MOS FETs 118 and 120, respectively. The MOS FETs 126 and 128 are also coupled to read/write and test control circuit 130. The control circuit 130 further has similar switching circuits to the switching circuits SW 5 and SW 6 and actuates the switching circuits to selectively render MOS FETs 126 and 128 conductive.

The bistable output terminals of flip-flop circuit formed by MOS FETs 118 and 120, or in other words, the drain electrodes of the latter are coupled to an input/output circuit 132 which applies to the bistable output terminals of the flip-flop circuit, a voltage having levels selected in response to data applied to the input terminal $V_{IN}$. The input/output circuit 132 further operates to supply a data in accordance with voltage levels at the bistable output terminals of the flip-flop circuit selectively through the switch SW 10, switch SW 12 or series circuit of inverter 134 and switch to output terminal $V_{OUT}$.

When the memory circuit of FIGS. 4 and 5 are set in a normal read/write mode of two-transistor memory cell, the switch SW 10 is closed to permit a data detected by the input/output circuit 132 and corresponding to the voltage level at the bistable output terminals of the flip-flop circuit to be derived at output terminal $V_{OUT}$. On the other hand, when the data holding characteristics of one of the MNOS FETs 10-11 to 10-MN are to be detected, the switch SW 12 is closed thereby to derive at output terminal $V_{OUT}$ a corresponding data to the voltage level at the bistable output terminals of flip-flop circuit. When the data holding characteristics of one of the MNOS FETs 12-11 to 12-MN are to be detected, the switch SW 14 is closed thereby to derive at output terminal $V_{OUT}$ a corresponding data to an inverted one of the voltage levels at the bistable output terminals of flip-flop circuit.

The gate voltages of MNOS FETs 10-11 to 10-MN and FETs 12-11 to 12-MN are controlled by row address decoder circuit 104 and gate driver circuit 102 and the substrate voltages of these MNOS FETs are controlled by substrate driver circuit 100, whereby the MNOS FETs 10-11 to 10-MN and 12-11 to 12-MN can be selectively set to write, erase and inhibit states in a similar manner as described in connection with the memory circuit of FIG. 1. A selected column of MNOS FETs are energized by column address decoder 110. Consequently, a desired one or ones of the MNOS FETs 10-11 to 10-MN and 12-11 to 12-MN can be selected. In respect to MNOS FET thus selected, write, readout and data holding characteristics test operations are performed in a similar manner as described in connection with the memory circuit of FIG. 1, but the output state of the flip-flop circuit formed of a pair of MOS FETs 118 and 120 is determined in the write mode by data received at input terminal $V_{IN}$ and supplied through the input/output circuit 132, and the output state of the flip-flop circuit in readout mode is read out through the input/output circuit 132 and the switch SW 10, SW 12 or SW 14 to output terminal $V_{OUT}$.

Figure 6:
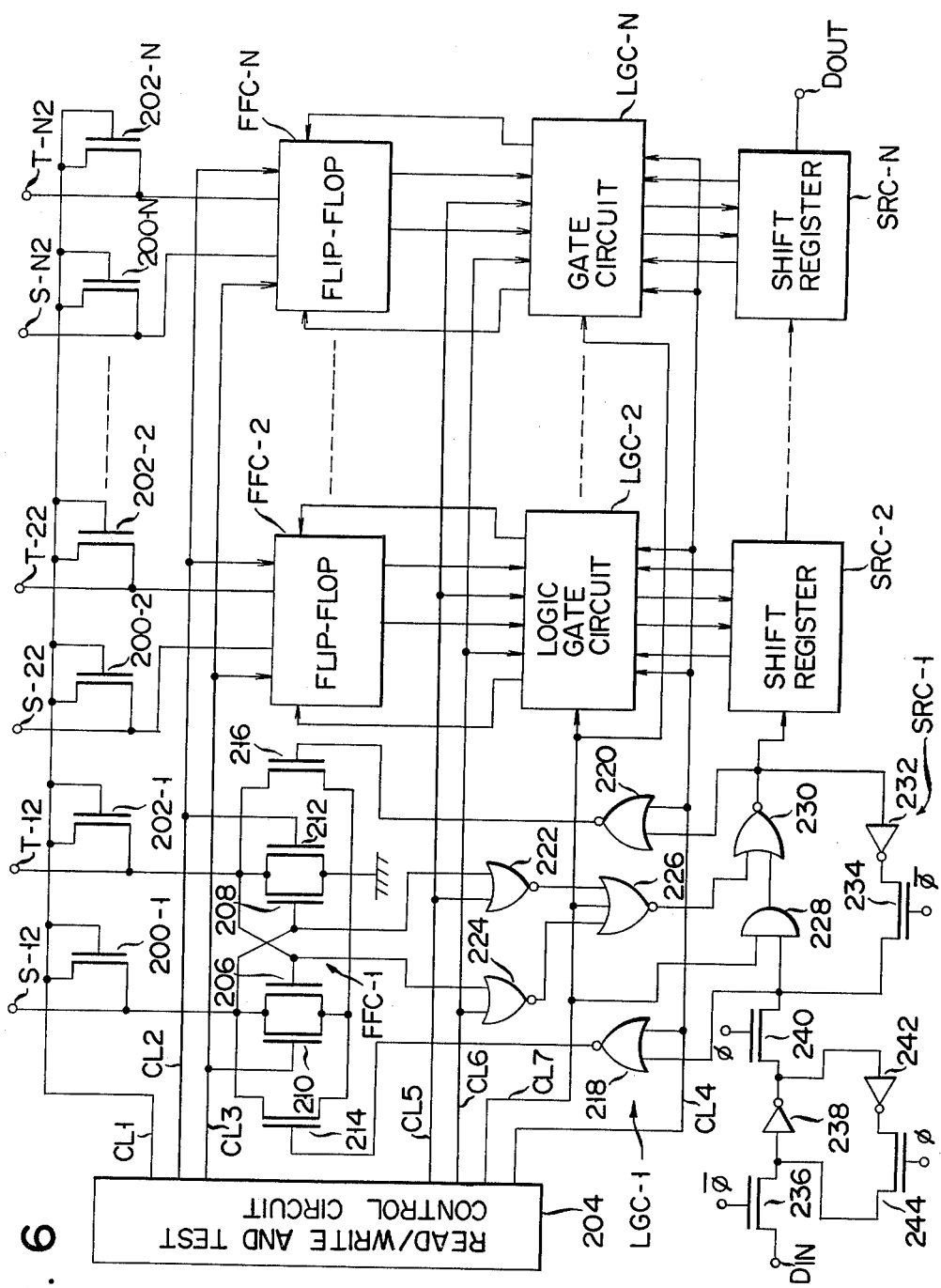
FIG. 6 shows a memory circuit section combined with the memory circuit section of FIG. 4, forming a nonvolatile memory apparatus according to still another embodiment.

FIG. 6 shows a second memory circuit section cooperating with the first memory circuit section of FIG. 4 to form a memory circuit according to still another embodiment of the invention. The second memory circuit section of FIG. 6 has connection terminals S-12 to S-N2 and T-12 to T-N2 to be coupled to the terminals S-1 to S-N and T-1 to T-N of the first memory circuit section of FIG. 4, respectively. The connection terminals S-12 and T-12, S-22 and T-22, . . . , and S-N2 and T-N2 in pair are coupled to the bistable output terminals of the flip-flop circuits FFC-1, FFC-2, . . . , and FFC-N, respectively. The bistable output terminals of the flip-flop circuits FFC-1, FFC-2, . . . , and FFC-N are coupled through the load MOS FETs 200-1 and 202-1, 200-2 and 202-2, . . . , and 200-N and 202-N and the control line CL1 to the read/write and test control circuit 204. The control circuit 204 has a similar switching circuit to the switching circuit SW 4 of FIG. 1 and allows the bistable output terminals of the flip-flop circuits FFC-1 to FFC-N to be selectively coupled through the load MOS FETs 200-1 to 200-N and 202-1 to 202-N to the power source terminal $V_G$. The flip-flop circuits FFC-1 to FFC-N are formed in a similar configuration to each other. The drawing shows only the flip-flop circuit FFC-1 in detail for clarity. The flip-flop circuit FFC-1 has MOS FETs 206, 208, 210 and 212 connected in a similar manner as the MOS FETs 18, 20, 26 and 28 of FIG. 1. The gate electrodes of MOS FETs 210 and 212 are coupled through control lines CL2 and CL3 to a control circuit 204. The control circuit 204 has switching circuits similar to the switching circuits SW 5 and SW 6 of FIG. 1 allowing the gate voltages of MOS FETs 210 and 212 to be selectively coupled to a power source terminal $V_G$ and ground. The flip-flop circuit FFC-1 further has MOS FETs 214 and 216 having the current paths coupled in parallel with those of MOS FETs 206 and 208, respectively. The gate electrodes of the MOS FETs 214 and 216 are coupled to the output terminals of NOR gates 218 and 220 of logic gate circuit LGC-1, respectively, the input terminals of the NOR gates 218 and 220 being coupled through control line CL4 to control circuit 204. The logic gate circuit LGC-1 further includes a NOR gate 222 having one input terminal coupled through a control line CL5 to the control circuit 204 and the other input terminal to the drain electrode of MOS FET 206, NOR gate 224 having one input terminal coupled through a control line CL6 to the control circuit 204 and the other input terminal to the drain electrode of MOS FET 208, and NOR gate 226 having two input terminals coupled to the output terminals of the NOR gates 222 and 224 and the third input terminal coupled through a control line CL7 to the control circuit 204.

The control line CL7 from the control circuit 204 is coupled to one input terminal of an AND gate 228 of a static shift register circuit SRC-1, while the output terminal of NOR gate 226 of logic gate circuit LGC-1 is coupled to one input terminal of NOR gate 230 which has the other input terminal coupled to the output terminal of the AND gate 228. The output terminal of NOR gate 230 is coupled to the other input terminals of NOR gate 218 of logic gate circuit LGC-1 and AND gate 228 of the static shift register circuit SRC-1 through inverter 232 and MOS FET 234 whose conduction state is controlled by a clock pulse $\phi$ from a clock pulse generator (not shown). Further, the output terminal of the NOR gate 230 is connected to the other input terminal of the NOR gate 220 of the logic gate circuit LGC-1. The data input terminal $D_{IN}$ of the static shift register circuit SRC-1 to the other input terminal of AND gate 228 through MOS FET 236 whose conduction state is controlled by clock pulse $\overline{\phi}$, invertor 238 and MOS FET 240 having the gate electrode applied with clock pulse $\overline{\phi}$. Across the input and the output terminals of invertor 238 coupled are invertor 242 and MOS FET 244 having the gate electrode applied with clock pulse $\overline{\phi}$.

The flip-flop circuits FFC-2 to FFC-N are coupled to shift register circuits SRC-2 to SRC-N through logic circuits LGC-2 to LGC-N, respectively, in an identical connection relationship to that of flip-flop circuit FFC-1, logic gate circuit LGC-1 and shift register circuit SRC-1. Moreover, the shift register circuits SRC-1 to SRC-N are cascade-connected.

In memory circuitry of FIGS. 4 and 6, the control line CL1 is energized to a high level potential in a normal readout operation and when the output states of flip-flop circuits FFC-1 to FFC-N are stably held. The potentials of control lines CL2 and CL3 are maintained at a low level in the normal operation, and when the data holding characteristics are to be checked, one of the control lines CL2 and CL3 is set to a high level while the other is set to a low level. The control line CL4 serves to control the data transfer from the shift register circuits SRC-1 to SRC-N to the flip-flop circuits FFC-1 to FFC-N, and when the data transfer is performed, is set to a low level potential. One of the control lines CL5 and CL6 is set to a high level potential while the other is set to a low level potential, for the purpose of determining from which bistable output terminal of the flip-flop circuit FFC-1 the data should be read out. The control line CL7 is used to control the data transfer from the flip-flop circuit FFC-1 to the shift register circuit SRC-1, and it is normally maintained at a high level potential and set to a low level potential to effect the data transfer. The control lines CL1 to CL7 serve for the same purposes in connection with the other flip-flop circuits FFC-2 to FFC-N, logic gate circuits LGC-2 to LGC-N and shift register circuits SRC-2 to SRC-N.

The shift register circuits SRC-1 to SRC-N respond to clock pulses $\phi$ and $\overline{\phi}$ to sequentially shift a data supplied to the data input terminal $D_{IN}$. When the control line CL4 is set to a low level potential, data accommodated in, for instance, the shift register circuit SRC-1 is supplied through NOR gates 218 and 220 to MOS FETs 214 and 216 one of which is thereby rendered conductive. This sets the state of flip-flop circuit FFC-1 in accordance with the data in shift register circuit SRC-1. Thus, data in the shift register circuits SRC-1 to SRC-N are transferred in parallel to the flip-flop circuits FFC-1 to FFC-N. When output data of the flip-flop circuit FFC-1 is to be written in the shift register circuit SRC-1, the control lines CL5 and CL6 are set to high and low levels, respectively, while the control line CL7 is set to a low level. This causes an output data of the flip-flop circuit FFC-1 to determine an output data of the shift register circuit SRC-1 or an output level of NOR gate 230. Thus, data in the flip-flop circuits FFC-1 to FFC-N are transferred in parallel to the shift register circuits SRC-1 to SRC-N. The data in the shift register circuits SRC-1 to SRC-N are supplied from the output terminal $D_{OUT}$ to an external circuit (not shown) sequentially in response to clock pulses $\phi$ and $\overline{\phi}$. It is thus understood that the second memory circuit section shown in FIG. 6 provides in combination with the first memory circuit section of FIG. 4 a electrically alterable read only memory circuit which processes data of N bits by M words and inputs/outputs data in a serial manner.

This invention has been described with reference to the exemplary embodiments in the foregoings, but should not be limited thereto.

Figure 7:
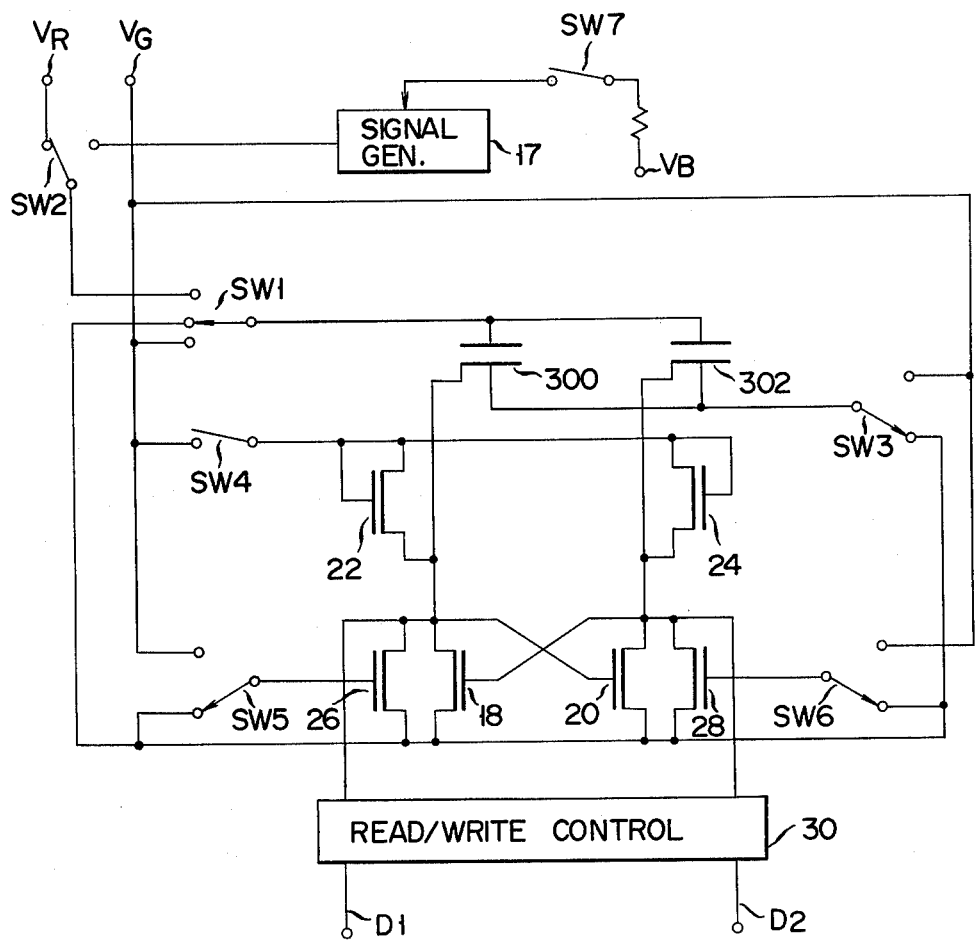
FIG. 7 shows a modification of the nonvolatile memory circuit of FIG. 1.

Whereas N-channel MOS FETs and MNOS FETs are used in the above described embodiments, P-channel MOS FETs and MNOS FETs may be used instead. Further, the variable threshold FETs are constituted by MNOS FETs in the described embodiments, but may be formed of FETs having insulation films with a trap zone, such as Metal-Alumina-Oxide-Semiconductor FET, FETs having insulation films with a ferroelectric film, or floating gate FETs. It is to be noted that such MNOS FETs may be replaced by MNOS capacitors as shown in FIG. 7. MNOS capacitors 300 and 302 in FIG. 7 forming a memory cell are of a similar construction as MNOS FETs 10 and 12 of FIG. 1 except that the MNOS capacitors do not have any drain zones formed therein. The memory circuit of FIG. 7 is similar to that of FIG. 1 except that MNOS FETs 10 and 12 are replaced by MNOS capacitors 300 and 302 and that load MOS FETs 14 and 16 are omitted, and operates in a similar manner as the memory circuit of FIG. 1.

What is claimed is:

1. A nonvolatile semiconductor memory apparatus comprising:
   a flip-flop circuit formed of a pair of gate insulated field effect transistors and having bistable output terminals;

a memory section having at least one memory cell, said memory cell having a pair of nonvolatile memory cell elements whose memory state can be repeatedly changed and which are coupled to said bistable output terminals of said flip-flop circuit, respectively;

shortcircuiting means for selectively shortcircuiting the current paths of said pair of gate insulated field effect transistors; and control voltage supply means for applying a control voltage to said memory cell elements for setting a mode of operation of said memory cell.

2. The nonvolatile semiconductor memory apparatus according to claim 1 wherein said pair of nonvolatile memory cell elements are formed of a pair of variable threshold voltage field effect transistors having the current paths coupled to said bistable output terminals of said flip-flop circuit, respectively, and the gate coupled to said control voltage supply means.

3. The nonvolatile semiconductor memory apparatus according to claim 1 or 2, further comprising voltage signal supply means for applying a predetermined voltage signal to said bistable output terminals of said flip-flop circuit.

4. The nonvolatile semiconductor memory apparatus according to claim 1 or 2, wherein said memory section has a plurality of memory cells arrayed in matrix.

5. The nonvolatile semiconductor memory apparatus according to claim 4, which further comprises plural pairs of switching elements arranged for respective columns and means for selectively energizing said pairs of switching elements, and in which said pairs of memory cell elements forming those of said memory cells which are arranged in the same column are coupled through said pair of switching elements to said bistable output terminals of said flip-flop circuit, respectively.

6. The nonvolatile semiconductor memory apparatus according to claim 1 or 2, wherein said shortcircuiting means includes a pair of gate insulated field effect transistors coupled to have the current paths in parallel with the current paths of said pair of gate insulated field effect transistors, respectively.

7. The nonvolatile semiconductor memory apparatus according to claim 1, wherein said pair of nonvolatile memory cell elements are formed of a pair of nonvolatile MNOS capacitors having sources coupled to said bistable output terminals of said flip-flop circuit, respectively and the gates coupled to said control voltage supply means.

8. The nonvolatile semiconductor memory apparatus according to claim 7, further comprising voltage signal supply means for applying a predetermined voltage signal to said bistable output terminals of said flip-flop circuit.

9. The nonvolatile semiconductor memory apparatus according to claim 7, wherein said memory section has a plurality of memory cells arrayed in matrix.

10. The nonvolatile semiconductor memory apparatus according to claim 9, which further comprises pairs of switching elements arranged for respective columns and means for selectively energizing said pairs of switching elements, and in which said pair of memory cell elements froming those of said memory cells which are arranged in the same column are coupled through said pair of switching elements to said bistable output terminals of said flip-flop circuit, respectively.

11. The nonvolatile semiconductor memory apparatus according to claim 7, wherein said shortcircuiting means includes pair of gate insulated field effect transistors coupled to have the current paths in parallel with the current paths of said pair of gate insulated field effect transistors, respectively.

12. A nonvolatile semiconductor memory apparatus comprising:

a plurality of flip-flop circuits each formed of a pair of gate insulated field effect transistors and having bistable terminals;

a memory section coupled to each of said flip-flop circuits, and having at least one memory cell, said memory cell including a pair of nonvolatile memory cell elements whose memory state can be repeatedly changed and which are coupled to said bistable output terminals of the respective flip-flop circuits;

shortcircuiting means for selectively shortcircuiting the current paths of said pair of gate insulated field effect transistors;

control voltage supply means for applying a control voltage to said memory cell elements for setting a mode of operation of said memory cell;

a plurality of cascade-connected shift register circuits; and data transfer control means coupled between said plurality of flip-flop circuits and cascade-connected shift register circuits for controlling a data transfer between said flip-flop circuits and shift register circuits.

13. The nonvolatile semiconductor memory apparatus according to claim 12, wherein said pair of nonvolatile memory cell elements are formed of a pair of variable threshold field effect transistors having the current paths coupled to said bistable output terminals of said flip-flop circuit, respectively, and the gates coupled to said control voltage supply means.

14. The nonvolatile semiconductor memory apparatus according to claim 12 or 13, further comprising voltage signal supply means for applying prescribed voltage signal to said bistable output terminals of said flip-flop circuits.

15. The nonvolatile semiconductor memory apparatus according to claim 12 or 13, wherein said shortcircuiting means includes a pair of gate insulated field effect transistors coupled to have the current paths in parallel with the current paths of said pair of gate insulated field effect transistors, respectively.

16. The nonvolatile semiconductor memory apparatus according to claim 12, wherein said pair of nonvolatile memory cell elements are formed of a pair of nonvolatile MNOS capacitors having sources coupled to said bistable output terminals of said flip-flop circuit, respectively and the gates coupled to said control voltage supply means.

17. The nonvolatile semiconductor memory apparatus according to claim 16, further comprising voltage signal supply means for applying a predetermined voltage signal to said bistable output terminals of said flip-flop circuit.

18. The nonvolatile semiconductor memory apparatus according to claim 16, wherein said shortcircuiting means includes pair of gate insulated field effect transistors coupled to have the current paths in parallel with the current paths of said pair of gate insulated field effect transistors, respectively.

* * * * *